(12) United States Patent
Hershenson et al.

(10) Patent No.: US 6,311,145 B1
(45) Date of Patent: Oct. 30, 2001

(54) OPTIMAL DESIGN OF AN INDUCTOR AND INDUCTOR CIRCUIT

(75) Inventors: Maria del Mar Hershenson, Palo Alto; Stephen P. Boyd, Stanford; Sunderarajan S. Mohan, Mountain View, all of CA (US)

(73) Assignee: The Board of Trustees of the LeLand Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/335,227

(22) Filed: Jun. 17, 1999

(51) Int. Cl.[7] .............................. G06F 17/50; G06F 17/11
(52) U.S. Cl. ........................ 703/2; 716/2; 716/11
(58) Field of Search .............................. 703/2, 13; 716/1, 716/2, 5, 11, 6; 333/219, 185; 310/68 R; 343/742

(56) References Cited

U.S. PATENT DOCUMENTS

| | | | |
|---|---|---|---|
| 4,053,856 | * 10/1977 | Fisher et al. | 333/219 |
| 4,808,868 | * 2/1989 | Roberts | 310/68 R |
| 4,827,428 | * 5/1989 | Dunlap et al. | 716/6 |
| 5,442,369 | * 8/1995 | Van Voorhies et al. | 343/742 |
| 5,844,451 | * 12/1998 | Murphy | 333/185 |

OTHER PUBLICATIONS

M. Del Mar Hershenson et al., Optimization of Inductor Circuits via Geometric Programming, Design Automation Conference, 1999, Proceedings, 36th, pp. 994–998, Jan. 1999.*

S.S. Mohan et al., Bandwidth Extension in CMOS with Optimized On–Chip Inductors, IEEE Journal of Solid–State Circuits, vol. 35, No. 3, March 2000, pp. 346–355.*

M. Park, Frequency–Dependent Series Resistance of Monolithic Spiral Inductors, IEEE Microwave and Guided Wave Letters, vol. 9, No. 12, Dec. 1999, pp. 514–516.*

* cited by examiner

Primary Examiner—Kevin J. Teska
Assistant Examiner—Russell W. Frejd
(74) Attorney, Agent, or Firm—Blakely, Sokoloff, Taylor & Zafman LLP

(57) ABSTRACT

A method for the design and optimization of inductors for RF circuits. This method consists in the formulation of RF circuit designs as geometric programs. The designer can specify a wide variety of specifications such as gain, bandwidth, noise, etc. The method, which was implemented in simple code, determines inductor dimensions and component values in a few seconds real-time. The results was also a globally optimal design.

31 Claims, 11 Drawing Sheets

OPTIMAL DESIGN OF AN INDUCTOR AND INDUCTOR CIRCUIT

RELATED CASES

This application is related to U.S. co-pending patent application Ser. No. 09/123,129, filed Jul. 28, 1998, and is entitled "System and Method for Designing Integrated Circuits," which is assigned to the assignee of the present invention.

BACKGROUND OF THE DISCLOSURE

1. Field of the Invention

The invention relates to the field of designing inductors and inductor circuits particularly for integrated circuits.

2. Prior Art

There is a growing need for optimally designed inductors and integrated circuit, as radio-frequency integrated circuits (RFICs) become more widely used in low-cost communications. This, for instance, has created great demand and interest in on-chips spiral inductors. The parasitic resistance and capacitance associated with these spiral inductors result in several engineering trade-offs. Unfortunately, no inductor optimization tool exists to aid in circuit design. Currently most designers are limited to use of a library of previously fabricated inductors or generating a large database of inductors using a 3-D field solver. While the former option severely constrains the available design space, the latter one requires a sophisticated search engine and is numerically expensive, especially when process parameters change. Moreover, neither approach is amenable to the application dependent nature of inductor design. For example, while a resonator requires an inductor that maximizes the magnitude of the impedance at the resonant frequency (subject to a specific load capacitance), a shunt-peaked amplifier requires one that maximizes bandwidth. Consequently, the optimal layout of these inductors is determined by the design goals.

A variety of limited computer-aided-design (CAD) tools have been developed for analog circuit design, including optimization tools. In general, these tools do not provide good results for inductors in integrated circuits.

The TILOS optimization system applies geometric programming to digital circuit design, and more specifically to transistor and wire sizing for Elmore delay minimization, as described in U.S. Pat. No. 4,827,428. The geometric programs that arise in Elmore delay minimization are very specialized (the only exponents that arise are 0 and ±1). Furthermore, the representation of the problem as a geometric program is only approximate (since the actual circuits are nonlinear, and the threshold delay, not Elmore delay, is the true objective).

Thus, an improved optimization method that quickly generates globally optimal designs for an inductor and inductor circuits is needed.

SUMMARY OF THE INVENTION

A method for optimally designing an inductor or inductor circuit is disclosed. An equivalent circuit of the inductor or inductor circuit using lumped parameters is first selected. Then for each lumped parameter, a posynomial expression is obtained. Next inductor performance specifications such as quality factor or self-resonance frequency are written in posynomial form. Then a problem in which performance specification is optimized subject to constraints on other performance specifications is written as a geometric program in posynomial form. This method may be used to design inductors for low noise amplifiers, matching networks, resonators, LC resonators, shunt-peaked amplifiers and the like.

DETAILED DESCRIPTION OF THE PRESENT INVENTION

A method is described for optimizing inductors and inductor circuits and more particularly useful in integrated circuits to optimize RF inductors and inductor circuits. In the following description numerous specific details will be set forth in order to provide a thorough understanding of the present invention. It will be apparent to one skilled in the art that the present invention may be practiced without these specific details. In other instances, well-known mathematical techniques have not been described in detail in order not to obscure the present invention.

In co-pending application patent application Ser. No. 09/123,129, filed Jul. 28, 1998, entitled "System and Method for Designing Integrated Circuits," computer aided design tools for designing globally optimal integrated circuits using geometric programs is described. As described in automated synthesis of globally optimal circuit designs for a given circuit topology library is obtained directly from a user defined specification. The present invention is an extension of this technology to the design of an inductor and inductor circuits. A simple and efficient CAD tool for designing an on-chip spiral inductor circuit is described in detail. The tool is based on geometric programming and a relatively simple well-known inductor model described in terms of lumped parameters where each of the parameters is represented by a posynomial expression.

Figure 1:
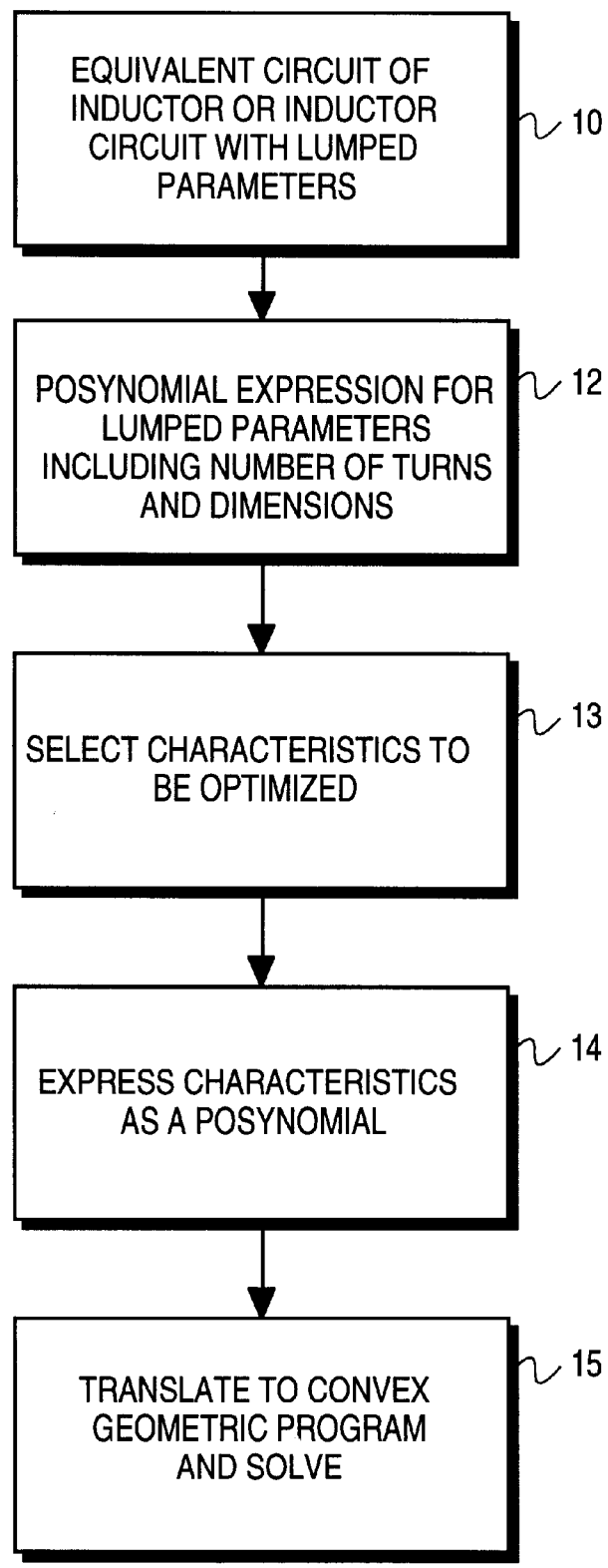
FIG. 1 is a block diagram illustrating the method of the present invention.

Referring first to FIG. 1, the method of the present invention first chains an equivalent circuit of an inductor or inductor circuit where each of the elements of the circuit are represented as lumped parameters. Each lumped parameter is then expressed as a posynomial expression. A term for inductance is also used which includes only layout dependent variables such as the number of turns and the dimensions of the spiral inductor. This is shown by step 12 of FIG. 1. Following this as shown by step 13, a characteristic of the inductor or circuit which is to be optimized is selected. For instance, the quality factor for an inductor is often an important consideration in the design if an integrated circuit inductor. The characteristic to be optimized is expressed as a inequality, many of the examples discussed below, thereby providing constraints needed to express the characteristic as a posynomial. In particular, as shown in steps 14 and 15, the optimization problem with objective and constraints in posynomial form is expressed as a geometric program in convex form that can be solved globally and efficiently.

If f is a real-valued function of n real, positive variables $x_1, x_2 \ldots, x_n$, is referred to as a posynomial function if it has the form $$f(x_1, \ldots, x_n) = \sum_{k=1}^{t} c_k x_1^{\alpha_{1k}} x_2^{\alpha_{2k}} \cdots x_n^{\alpha_{nk}}$$

where $c_j \geq 0$ and $a_{ij} \in R$. When t=1, f is called a monomial function. Thus, for example, $0.7 + 2x_1/x_3^2 + x_2^{0.3}$ is posynomial and $2.3(x_1/x_2)^{1.5}$ is a monomial. Posynomials are closed under sums, products and nonnegative scaling.

A geometric program (GP) has the form $$\begin{aligned} \text{minimize} \quad & f_0(x) \\ \text{subject to} \quad & f_i(x) \leq 1, \quad i = 1, 2, \ldots, m \\ & g_i(x) = 1, \quad i = 1, 2, \ldots, p \\ & x_i > 0, \quad i = 1, 2, \ldots, n, \end{aligned} \quad (1)$$

where $f_i$ are posynomial functions and $g_i$ are monomial functions. If f is a posynomial and g is a monomial, then the constraint $f(x) \leq g(x)$ can be expressed as $f(x)/g(x) \leq 1$ (since f/g is posynomial). From closure under non-negativity, constraints of the form $f(x) \leq a$, where a>0 can also be used. Similarly, if $g_1$ and $g_2$ are both monomial functions, the constraint $g_1(x) = g_2(x)$ can be expressed as $g_1(x)/g_2(x) = 1$ (since $g_1$ and $g_2$ is monomial).

In general, posynomial functions are not necessarily convex. A simple change of variables converts the posynomial objective functions and constraints into convex functions. If $y_1 = \log x_1$, and take the logarithm of a posynomial f yields $$h(y) = \log(f(e^{y_1}, \ldots, e^{y_n})) = \log\left(\sum_{k}^{t} e^{a_k^T y + b_k}\right)$$

where $\alpha_k^T = [\alpha_{1k} \ldots \alpha_{nk}]$ and $b_k = \log c_k$. It can be shown that h is a convex function of y. This transformation converts the standard geometric program (1) into the convex program:

$$\begin{aligned} \text{minimize} \quad & \log f_0(e^{y_1}, \ldots, e^{y_n}) \\ \text{subject to} \quad & \log f_i(e^{y_1}, \ldots, e^{y_n}) \leq 0, \quad i = 1, \ldots, m \end{aligned} \quad (2)$$

-continued
$$\log g_i(e^{y_1}, \ldots, e^{y_n}) \leq 0, \quad i = 1, \ldots, p.$$

This is the exponential form of the geometric program. Since this problem is convex, an efficient interior-point method can be used to solve it. The most important feature of geometric programs is that they can be globally solved with great efficiency. The algorithm determines whether the problem is infeasible (i.e., no design can meet all constraints). Also, the starting point for the optimization algorithm does not have any effect on the solution.

Efficient interior point methods to solve geometric programs have recently been developed. One such method is described by K. O. Kortanek, X. Xu, and Y. Ye, "An Infeasible Interior-point Algorithm for Solving Primal and Dual Geometric Programs," *MathProgramming*, 76:155–181, 1996, which is hereby incorporated by reference. This method has the desirable feature of exploiting sparsity in the problem, i.e., efficiently handling problems in which each variable appears in only a few constraints. Additional methods of solving geometric programs are described in: Y. Nesterov and A. Nemirovsky, "Interior-Point Polynomial Methods in Convex Programming," Volume 13 of *Studies in Applied Mathematics*, SIAM, Philadelphia, Pa., 1994; and A. Fiacco and G. McCormick, *NonlinearProgramming: Sequential Unconstrained Minimization Techniques*, Wiley 1968 (Reprinted in SIAM Classics in Applied Mathematics series 1990) which are hereby incorporated by reference.

For the purposes of the present invention, the most important feature of geometric programs is that they can be globally solved with great efficiency. Perhaps even more important than the great efficiency is the fact that the present invention geometric programming method always obtains the global minimum. Infeasibility is unambiguously detected: if the problem is infeasible, then the method determines this fact. This is in contrast to conventional optimization systems that just fail to find a feasible point. Another benefit of the global solution is that the initial starting point is irrelevant, the same global solution is found no matter what the initial starting point is.

A primal barrier method can be used to solve the exponential form problem. In one embodiment, using a primal only method without exploiting sparsity, and with the overhead of an interpreted language, the geometric programs arising in an op-amp design example discussed below were all solved in approximately one to two seconds on an ULTRA SPARCI1, 170 MHz. The efficiency of the method can be increased by using a C implementation of a primal-dual method.

Figure 2:
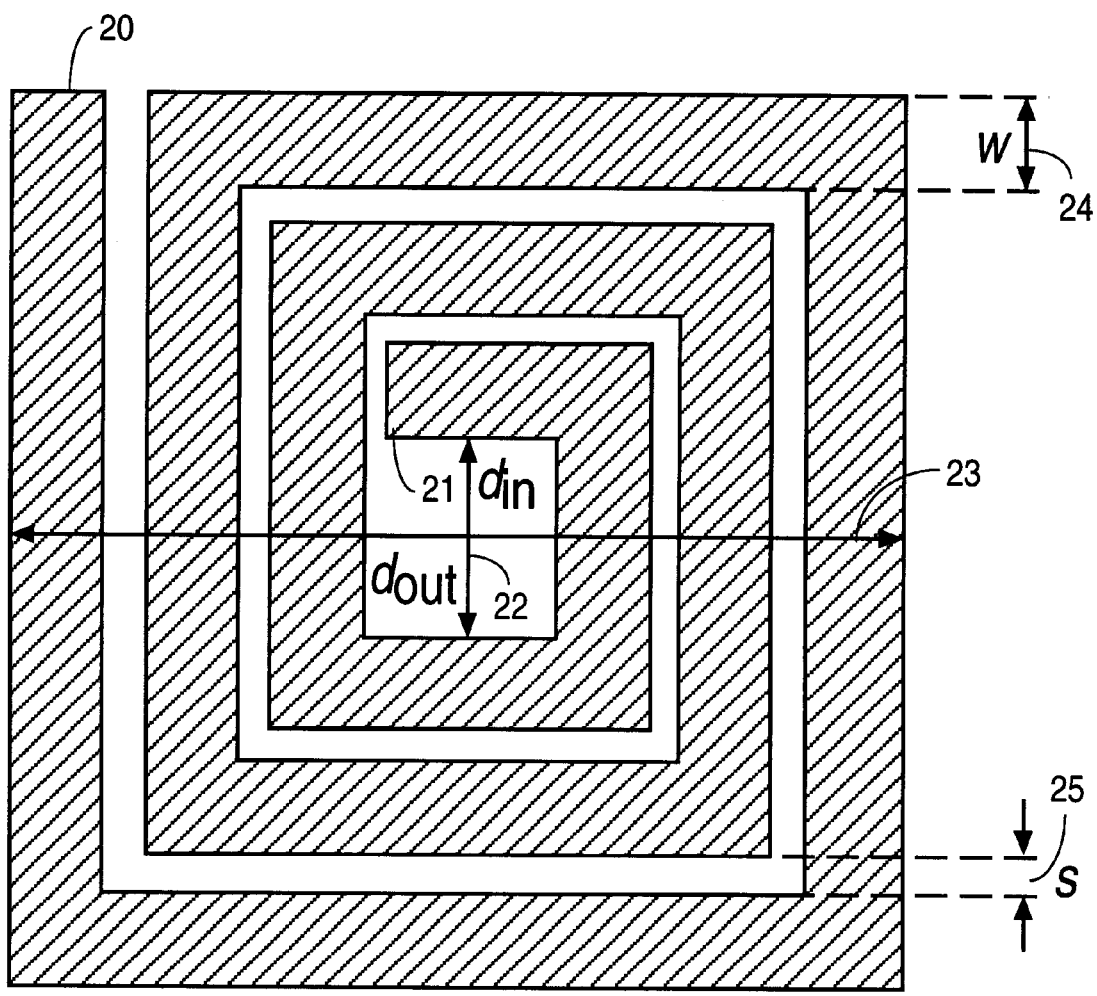
FIG. 2 is a plan view of a spiral inductor.

FIG. 2 is a plan view of a spiral conductor of the type typically fabricated in an integrated circuit using ordinary photolithographic techniques. The inductor may be fabricated from metal or polysilicon and in some cases as will be discussed, is fabricated on a grounded shield. The ends of the inductor 20 and 21 are not shown connected in FIG. 2. As will be discussed, a monomial expression is used to represent the inductance (equation 4) in an equivalent circuit. This expression is independent of process variables and parameters and uses only the physical layout of the inductor. More specifically, the square, spiral inductor of FIG. 2 is defined by the number of turns (n) and the width of each turn (w) shown by dimension 24; the distance between each turn (s) shown by dimension 25, an outer diameter ($d_{out}$) shown by dimension 23 and an average diameter given by the equation $$(d_{av} = 0.5(d_{out} + d_{in})).$$

The average diameter makes use of the inner diameter shown as dimension 22. The variables w, s and $d_{out}$ are restricted to take values on a discreet grid typically defined by the process used to fabricate the inductor. The number of turns is restricted to take values that are integral multiples of 0.25. However, for purposes of the explanation below, continuous variables are used. Other geometric parameters that can be used are inductor length and inductor area.

Figure 3:
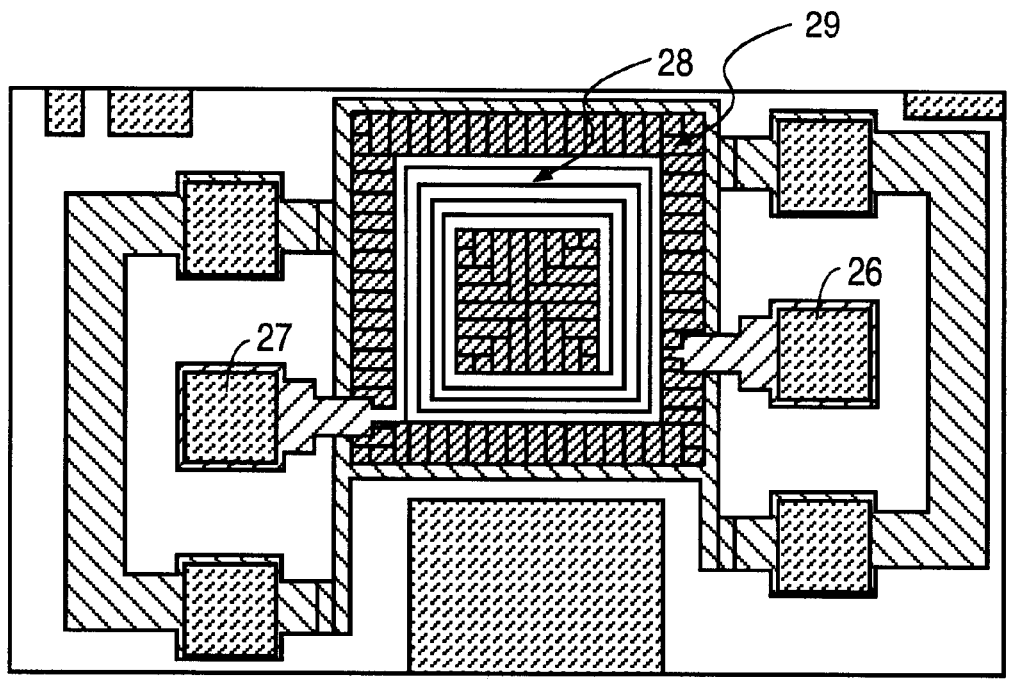
FIG. 3 is a plan view of a spiral inductor fabricated as an integrated circuit with a patterned ground shield (PGS).

Another inductor 28 is shown in plan view in FIG. 3. The ends of the inductor are connected to the pads 26 and 27 to permit testing of the inductor. This inductor uses a grounded polysilicon shield 29. This shield resembles a brick-like pattern which is broken regularly in the direction perpendicular to the current flow within the inductor. This shield is sometimes referred to as a patterned ground shield (PGS)

Figure 4:
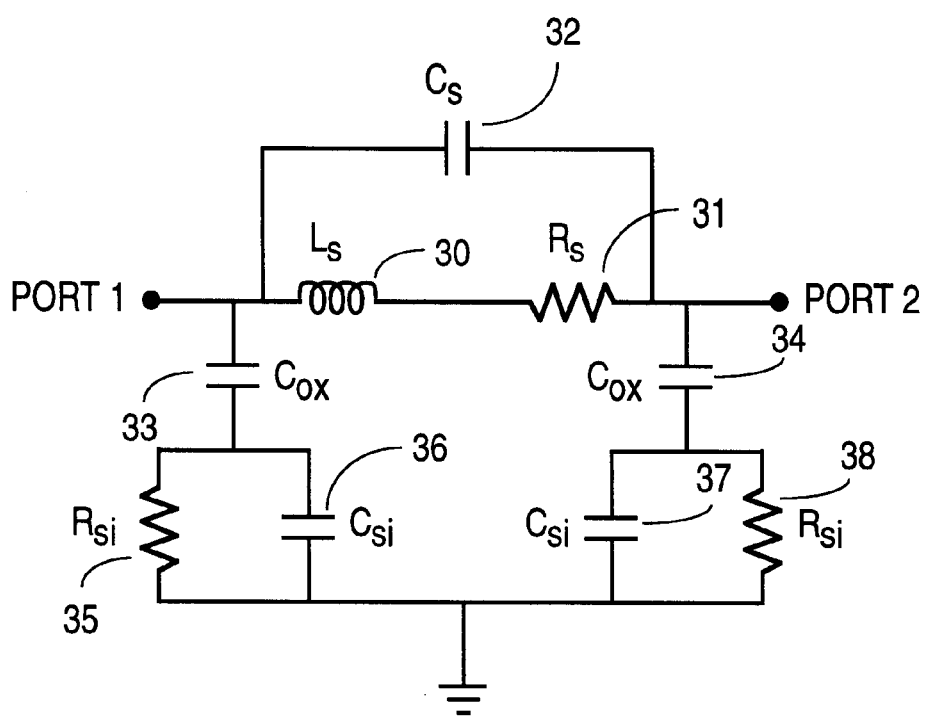
FIG. 4 is a two port equivalent circuit for an inductor.

The inductor of FIG. 2 may be represented as an equivalent circuit (two port model) such as shown in FIG. 4. As can be seen each of the elements in the equivalent circuit are lumped parameters which may be represented by posynomials and more specifically, in the case of FIG. 4 by monomial expressions.

The pure inductor 30 ($L_s$) is connected in series with a series resistance 31 ($R_s$) in the equivalent circuit. There is a feed-forward capacitance represented by capacitor 32 ($C_s$). This capacitance is due to the coupling between the spiral and the metal underpass required to connect the inner end of the spiral inductor to external circuitry. The capacitors 33 and 34 ($C_{ox}$) results from the spiral to substrate oxide capacitance. The resistor 35 ($R_{si}$) and the capacitor 36 ($C_{si}$) result from the substrate capacitance and the substrate spreading resistance. In the equivalent circuit this parallel combination of resistance 38 and capacitance 37 occurs also at the second port.

Relatively accurate closed-form expressions exist for each of the circuit elements of FIG. 4 as follows:

$R_s$: The series resistance is given by $$R_s = \frac{l}{\sigma w \delta \left(1 - e\left(\frac{-t}{\delta}\right)\right)} = k_1(\omega)\frac{l}{w}, \tag{3}$$

where $\sigma$ is the conductivity, and t is the turn thickness and $\delta$, the skin length, is given by $$\delta = \sqrt{\frac{2}{\omega \mu_o \sigma}},$$

where $\omega$ is the frequency, is the magnetic permeability of free space ($\mu = 4\pi 10^{-7}$ H/m) and $k_1$, ($\omega$) is a constant that depends on frequency and technology parameters. Since the length is given by a monomial expression ($l = 4nd_{avg}$), expression (3) is also a monomial.

$L_s$: An accurate monomial expression for the inductance is $$L_s = \beta d_{out}^{\alpha_1} w^{\alpha_2} d_{avg}^{\alpha_3} n^{\alpha_4} s^{\alpha_5}, \tag{4}$$

where the coefficients $\beta$ and $\alpha_1$ are only layout dependent and do not depend on the technology ($\beta = 1.66 \cdot 10^{-3}$, $\alpha_1 = -1.33, \alpha_2 = -0.125, \alpha_3 = 2.50, \alpha_4 = 1.83, \alpha_5 = -0.022$).

This expression exhibits a maximum error of 8% over a broad design space.

$C_{ox}$: The spiral-substrate oxide capacitance accounts for most of the inductor's parasitic capacitance. It can be approximated by a monomial expression $$C_{ox} = \frac{1}{2}\frac{\epsilon_{ox}}{t_{ox}}lw = k_2 lw, \tag{5}$$

where $\epsilon_{ox}$ is the oxide permitivity. ($\epsilon_{ox} = 3.4510^{-13}$F/cm), $t_{ox}$ is the oxide thickness between the spiral and the substrate and $$k_2 = \frac{1}{2}\frac{\epsilon_{ox}}{t_{ox}}$$

is a technology dependent constant.

$C_s$: This capacitance is mainly due to the capacitance between the spiral and the metal under-pass required to connect the inner end of the spiral inductor to external circuitry. It is modeled by the monomial expression, $$C_s = \frac{\epsilon}{t_{ox,M1-M2}} nw^2 = k_3 nw^2, \tag{6}$$

where $t_{ox,M1-M2}$ is the oxide thickness between the spiral and the under-pass, and $$k_3 = \frac{\epsilon_{ox}}{t_{ox,M1-M2}}$$

is a technology dependent constant.

$C_{si}$: The substrate capacitance is given by the following monomial expression, $$C_{si} = \tfrac{1}{2}C_{sub}lw = k_4 lw, \tag{7}$$

where $C_{sub}$ is the substrate capacitance per unit area and $$k_4 = \frac{C_{sub}}{2}$$

is a technology dependent constant.

$R_{si}$: The substrate resistance can be expressed as $$R_{si} = \frac{2}{G_{sub}lw} = k_5 \frac{1}{lw}, \tag{8}$$

where $G_{sub}$ is the substrate conductance per unit area and $$k_5 = \frac{2}{G_{sub}}$$

is a technology dependent constant. Note that equation (8) is monomial.

Figure 5:
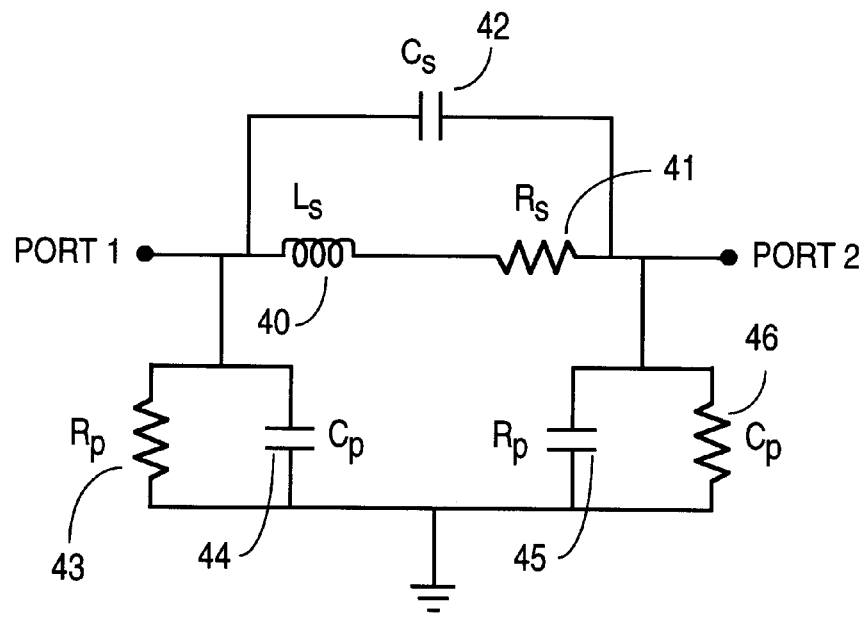
FIG. 5 is a simplified two port equivalent circuit for an inductor.

A somewhat simpler equivalent circuit for the inductor of FIG. 2 is shown in FIG. 5, again as a two-port model. In addition to $C_s$, $L_s$ and $R_s$ previously discussed, this equivalent circuit has the parallel combination of a resistor 33 and a capacitor 44 at one port and a resistor 45 and a capacitor 46 at the other port. In this equivalent circuit, $R_p$ and Cp are frequency dependent and have the following expressions:

$R_p$: The shunt resistance is given by the monomial expression, $$R_p = \frac{1 + [\omega R_{si}(C_{si} + C_{ox})]^2}{\omega^2 R_{si} C_{ox}^2} = k_6(\omega) \frac{1}{lw}, \quad (9)$$

where the technology and frequency dependent constant $k_6(\omega)$ is given by $$k_6(\omega) = \frac{2 G_{sub} t_{ox}^2}{\omega^2 \epsilon_{ox}^2} + \frac{2}{G_{sub}} \left(1 + \frac{C_{sub} t_{ox}}{\epsilon_{ox}}\right)$$

$C_p$: The shunt capacitance is given by the posynomial expression, $$C_p = \frac{C_{ox} + \omega^2 R_{si}(C_{si} + C_{ox}) C_{si} C_{ox}}{1 + [\omega R_{si}(C_{si} + C_{ox})]^2} \quad (10)$$

$$= k_7(\omega) lw + k_8(\omega)(lw)^2,$$

where $k_7(\omega)$ and $k_8(\omega)$ are technology and frequency dependent constants given by $$k_7(\omega) = \frac{\epsilon_{ox}}{2 t_{ox} + 2 t_{ox} \left[\frac{\omega}{G_{sub}}\left(\frac{\epsilon_{ox}}{t_{ox}} + C_{sub}\right)\right]^2} \quad (10a)$$

$$k_7(\omega) = \frac{\epsilon_{ox}}{2 t_{ox} + 2 t_{ox} \left[\frac{\omega}{G_{sub}}\left(\frac{\epsilon_{ox}}{t_{ox}} + C_{sub}\right)\right]^2} \quad (10b)$$

In some cases, the placement of a PGS beneath the inductor improves performance. The PGS eliminates the resistive and capacitive coupling to the substrate at the expense of the increased oxide capacitance. The expressions for $C_{ox}$, $R_p$ and $C_p$ are given by:

$$R_p = \infty \quad (10c)$$

$$C_{ox} = \frac{1}{2} \frac{\epsilon_{ox}}{t_{ox,po}} lw = k_2^* lw,$$

$$C_p = C_{ox},$$

where $t_{ox,po}$ is the oxide thickness between the spiral and the polysilicon layer, and $k_2$ * is a technology dependent constant. The expressions for $L_s$ and $R_s$ are not altered by the PGS.

Figure 6:
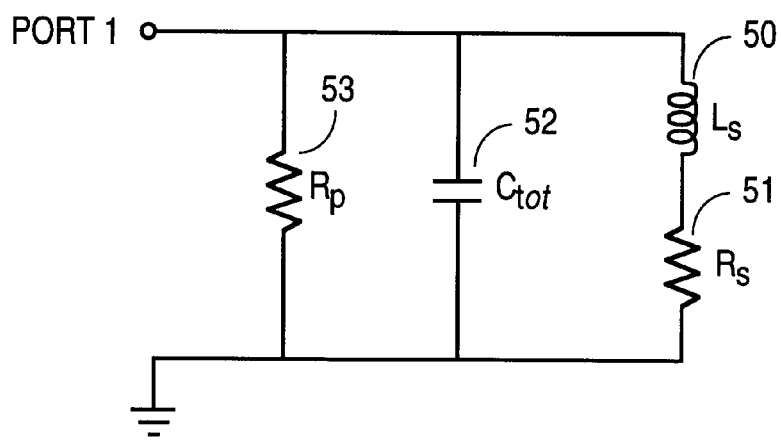
FIG. 6 is a single port equivalent circuit for an inductor.

In FIG. 6 a one-port equivalent circuit for the inductor is shown. It includes the series inductor 50 and series resistor 51 ($L_s$, $R_s$) and the parallel resistor 53 ($R_p$) and parallel capacitor 52 ($C_{tot}$). The total shunt capacitance ($C_{tot}$) is equal to $C_s$ plus $C_p$ and is a posynomial since both $C_s$ and $C_p$ are given by monomial expressions. As will be discussed below, a wide variety of inductor design specifications which typically optimize performance result in posynomial restraints.

Assume first one seeks the minimum quality factor $Q \leq Q_{min}$. The quality factor can be defined as the ratio of peak magnetic energy minus peak electric energy to energy loss in one cycle. This results in the expression $$Q_{ME} = \frac{\omega L_s}{R_s} \cdot \frac{\overline{R_p}}{\overline{R_p} + \left[\left(\frac{\omega L_s}{R_s}\right)^2 + 1\right] R_s} \cdot \left(1 - \frac{R_s^2 \overline{C_{tot}}}{L_s} - \omega^2 L_s \overline{C_{tot}}\right), \quad (11)$$

where $\overline{R_p} = 2 R_p$ and $\overline{C_{tot}} = C_{tot}/2$ for two-port devices and $\overline{R_p} = R_p$ and $\overline{C_{tot}} = C_{tot}$ for one-port devices. Often, circuit designers define the quality factor as the ratio of peak magnetic energy to energy loss in one cycle (for example, in resonator designs). In this case the quality factor is given by, $$Q_M = \frac{\omega L_s}{R_s} \cdot \frac{\overline{R_p}}{\overline{R_p} + \left[\left(\frac{\omega L_s}{R_s}\right)^2 + 1\right] R_s}. \quad (12)$$

Equations (11) and (12) are not posynomial in nature. However, the specification for minimum quality factor can be written as $$Q_{ME,min} \frac{R_s}{\omega L_s} + Q_{ME,min} \frac{R_s^2}{\omega L_s \overline{R_p}} \cdot \left[\left(\frac{\omega L_s}{R_s}\right)^2 + 1\right] + \quad (13)$$

$$\frac{R_s^2 \overline{C_{tot}}}{L_s} - \omega^2 L_s \overline{C_{tot}} \leq 1, \quad \text{or}$$

$$Q_{E,min} \frac{R_s}{\omega L_s} + Q_{ME,min} \frac{R_s^2}{\omega L_s \overline{R_p}} \cdot \left[\left(\frac{\omega L_s}{R_s}\right)^2 + 1\right] \leq 1. \quad (14)$$

Equations (13) and (14) are posynomial expressions in the design variables and in $Q_{ME,min}$ (or $Q_{E,min}$). Therefore a minimum required quality factor can be specified. Also the quality factor can be maximized by maximizing $Q_{ME,min}$ (or $Q_{E,min}$) subject to the constraints (13) or (14).

Assume for another restraint that the minimum resonance frequency is sought. The self-resonance frequency is the frequency at which the quality factor $Q_{ME}$ is zero. It is given by $$\omega_{sr}^2 = \frac{1}{L_s \overline{C_{tot}}} - \frac{R_s^2}{L_s^2}. \quad (15)$$

The specification of minimum self-resonance frequency results in a posynomial constraint in the design variables and $\omega_{sr,min}$, $$\omega_{sr,min}^2 L_s \overline{C_{tot}} + \frac{R_s^2 \overline{C_{tot}}}{L_s} \leq 1. \quad (16)$$

Therefore a specification on minimum self-resonance frequency the self-resonance frequency can be and maximized (by maximizing $\omega_{sr,min}$, subject to constraint (16)).

A simple capacitor constraint would be use of the posynomial constraint.

$$C_{tot} \leq C_{tot,max}. \quad (17)$$

Other inductor constraints can be imposed. For instance, the inductors can be made equal to some value or be written as some range.

$$L_s = L \quad L_{s,min} \leq L_s \leq L_{s,max}. \quad (18)$$

Typically the process determines the minimum geometries (e.g., turn spacing and width) and these constraints are monomials which can be dealt with readily by geometry processing $$w \geq w_{min} \quad s \geq s_{min}. \quad (19)$$

The maximum inductor area is also a monomial constraint represented by $$d_{out}^2 \leq \text{Area}_{max} \quad (20)$$

Additionally the area can be minimized if needed.

The average radius $d_{avg}$ is determined by the choice of $d_{out}$, n, w and s. They are related by the expression, $$d_{avg} + (n-1)s + nw = d_{out} \quad (21)$$

Since the spacing s is typically compared to $d_{out}$, and w, equation 21 can be approximated by $$d_{avg} + ns + nw = d_{out} \quad (22)$$

The following posynomial constraint can be imposed $$d_{avg} + ns + nw \leq d_{out}. \quad (23)$$

In many design problems the constraint (23) will be tight so equation (22) will hold. For all the design examples shown in this application constraint (23) is always tight.

Figure 7:
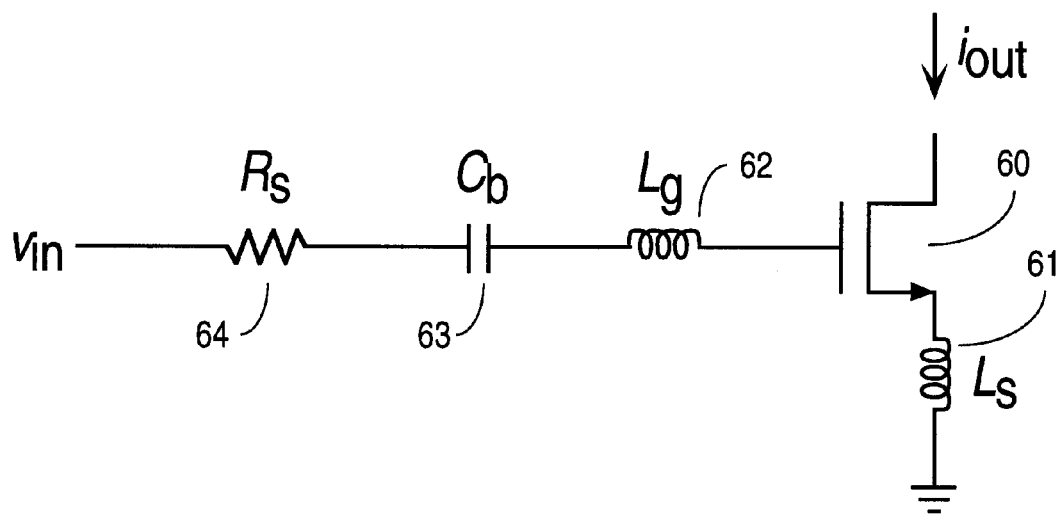
FIG. 7 is a circuit for a low-noise amplifier.

A common problem in inductor design is to maximize the quality factor for a given inductance value and for a minimum self-resonance frequency. For example, in a narrow-band low noise amplifier (LNA) such as the one shown in FIG. 7, the matching inductor 61 ($L_s$) is required to take a value $L_s = R_s C_{gs}/g_m$ where $C_{gs}$ is the gate to source capacitance and $g_m$ is the transconductance of transistor 60, both of which are determined once the size and/or power of transistor 60 is determined. In the circuit of FIG. 7 the off-chip components associated with the input circuit are a resistor 64, a capacitor 63 and an inductor 62 ($R_s$, $C_B$ and $L_g$, respectively). Ideally, the inductor 61 must have a high quality factor Q. The design problem can be expressed as follows $$\text{maximize} \quad Q_{min} \quad (24)$$
$$\text{subject to} \quad Q \geq Q_{min}$$
$$L = L_{req}$$
$$\omega_{sr} \geq \omega_{sr,min}$$
$$\ldots$$

For a particular input impedance, say 50 ohms, and a selected frequency $\omega_{sr}$, $Q_{MIN}$ can be expressed by the equations (13) or (14).

Figure 13:
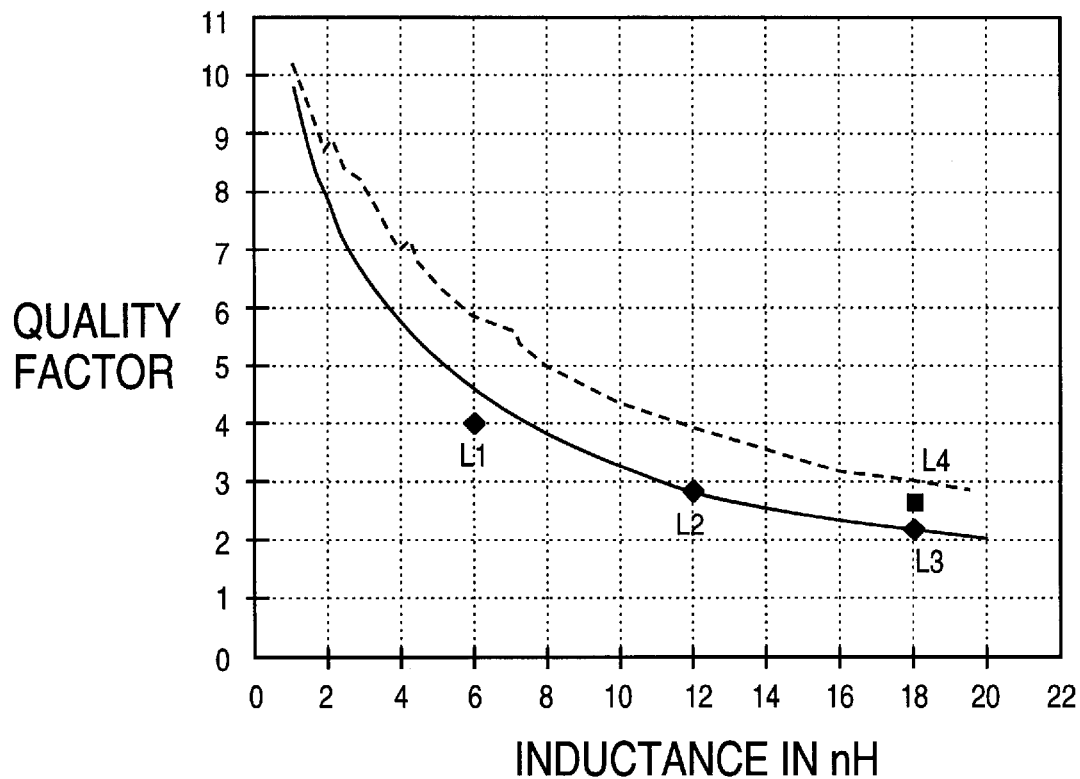
FIG. 13 is a graph illustrating the equality factor versus inductance at 2.5 GHz.
Figure 13:
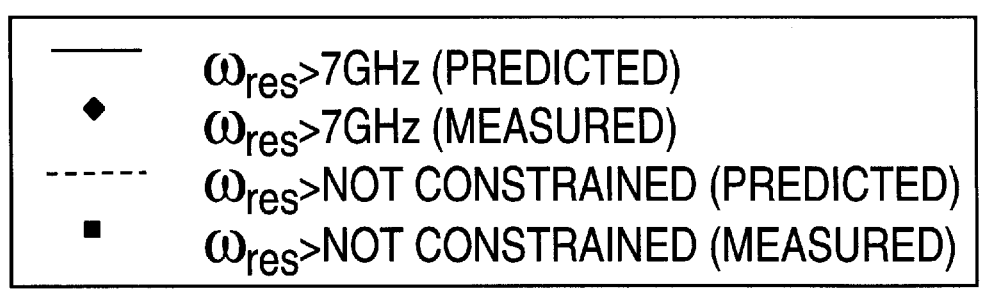

Other constraints that can be considered are, for example, the minimum spacing, turn width, maximum area, minimum parallel capacitance, etc. In any event, the problem can be formulated as a geometric program. By repeatedly solving optimal design considerations for different inductor circuit constraints, globally optimal trade-off curves, that helps in the choice of the optimal inductor, are easily obtained. The resultant curve of FIG. 13 shows the globally optimal trade-offs between quality factor and inductance value. This is shown for the minimum quality factor at 2.5 GHz versus the inductance value, in this case with PGS. The selected design restraints are shown below in Table 1. Note that when the self-resonance frequency is not constrained a higher $Q_{ME}$ results. Details of test indicators built are shown in Table 2 below. Note that the closeness between the predicted and measured data authenticates the inductor model used.

TABLE 1

| Area | $\leq 400\ \mu m^2$ |
| --- | --- |
| Metal Spacing | $\geq 1.9\ \mu m$ |

TABLE 1-continued

| Metal width | $\leq 1.9\ \mu m$ |
| --- | --- |
| Self-resonance frequency | $\geq 7$ GHz (curve 1) unconstrained curve 2 |
| Operation frequency | 2.5 GHz |

TABLE 2

| Name | n | dout ($\mu m$) | w ($\mu m$) | s ($\mu m$) |
| --- | --- | --- | --- | --- |
| L1 | 4.75 | 206.3 | 7.8 | 1.9 |
| L2 | 7.2 | 166.5 | 3.2 | 1.9 |
| L3 | 9.5 | 152.9 | 1.9 | 1.9 |
| L4 | 8 | 221.6 | 4.3 | 1.9 |
| L5 | 3.75 | 292.2 | 13 | 1.9 |
| L6 | 6.5 | 216.7 | 5.4 | 1.9 |

Test inductors (dimensions are in $\mu m$, $t_{ox,m5-poly} = 5.2\ \mu m$, $t_{M5} = 0.9\ \mu m$, $\sigma_{M5} = 3.10^5 (\Omega cm)^{-1}$).

Figure 14:
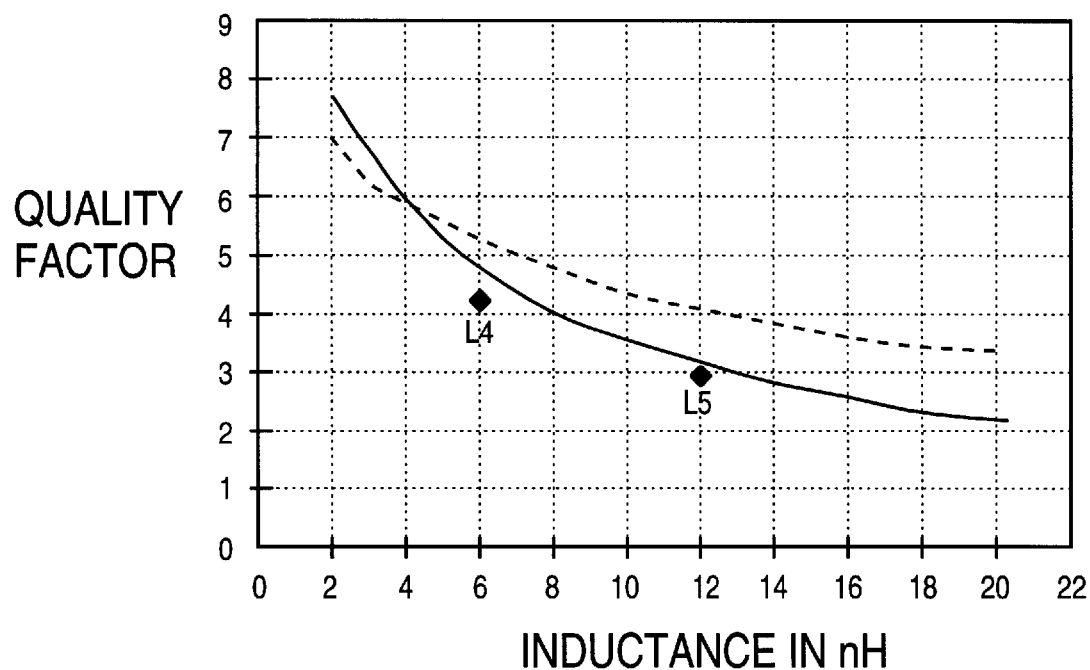
FIG. 14 is a graph illustrating the performance of an inductor without PGS.

In FIG. 14 the performance of inductors with and without PGS is shown. In both cases $Q_{ME}$ is maximized at an operating frequency of 1.5 GHz while meeting the specifications shown in Table 1 and guaranteeing a self-resonance frequency above 5 GHz. The PGS option is obviously preferred for small inductors because of the increase in $Q_{ME}$. This results from the elimination of the substrate loss which more than offsets the degradation due to the increase in oxide capacitance. This does not mean that PGS provides a benefit in every case and each example should be considered separately. The computations required for FIGS. 12 and 13, including the trade-off curves, can be done in real-time.

Figure 8:
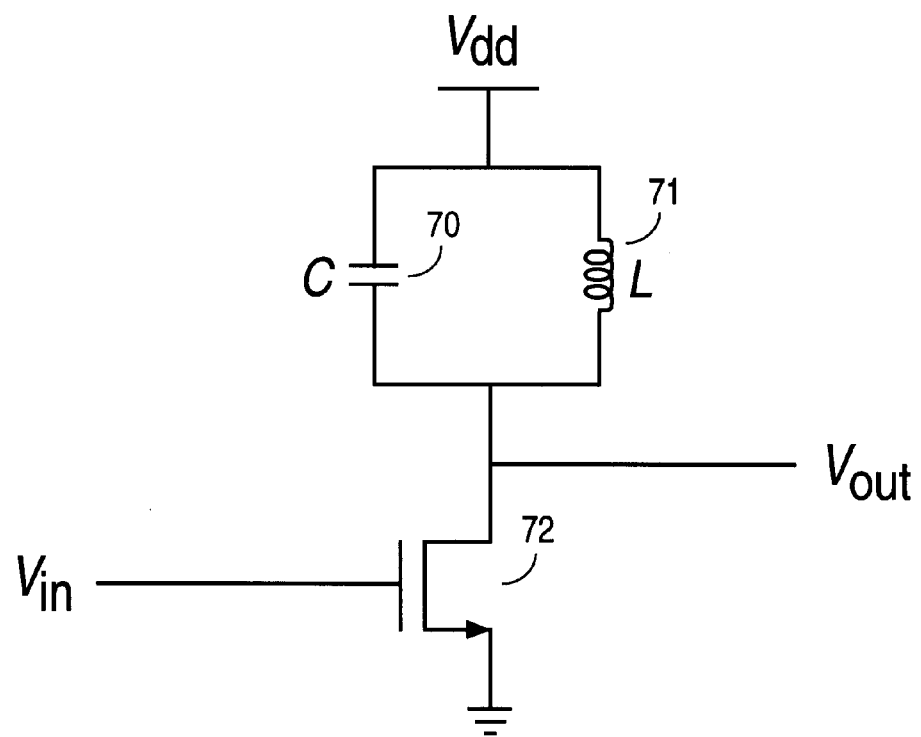
FIG. 8 is a circuit for an LC resonator.
Figure 9A:
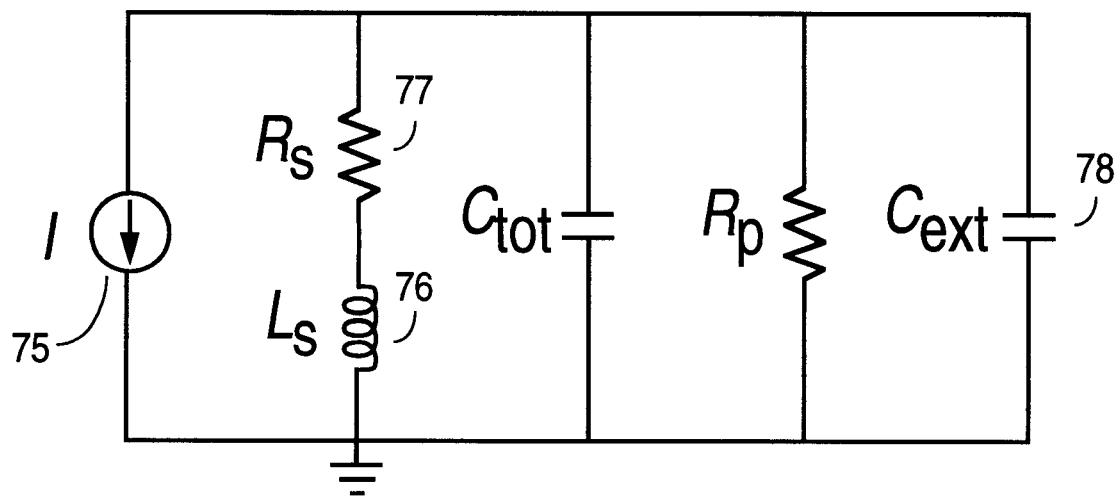
FIG. 9a is a small-signal equivalent circuit for the LC resonator of FIG. 8.
Figure 9B:
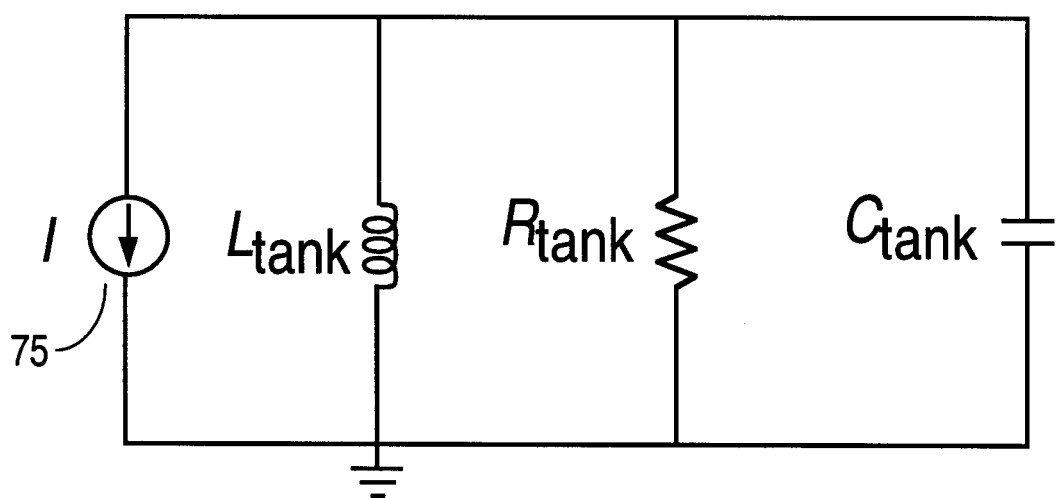
FIG. 9b is another equivalent circuit for the circuit of FIG. 8.

In FIG. 8 a simple tuned amplifier is shown which provides gain over selected frequencies. It includes a simple tank circuit comprising the inductor 71 and capacitor 70 and a transistor 72. A simplified small-signal equivalent circuit is shown in FIG. 9a. Here the transistor 72 of FIG. 8 has been replaced by an ideal transconductance amplifier 75. The inductor 71 has been replaced by an ideal inductor 76 ($L_s$) and includes a series resistor 77 ($R_s$), $C_{tot}$ and $R_p$ are described in connection with the single port equivalent circuit of FIG. 6. The capacitor 78 ($C_{ext}$) represents the additional load capacitance. A simplified small signal equivalent circuit is shown in FIG. 9b as the tank inductance and capacitance in parallel resistance ($L_{tank}$, $R_{tank}$ and d $C_{tank}$).

If the objective is to maximize the total parallel tank impedance for a given frequency ($\omega_{res}$) then for a practical tank quality factor $$\left( Q_{tank} = \frac{R_{tank}}{\omega_{res} L_{tank}} > 1.5 \right),$$

then the tank elements can be expressed as $$L_{tank} = \left[ 1 + \left( \frac{R_s}{L_s \omega} \right)^2 \right] L_s$$

$$R_{tank} = R_p \| R_{s,p} = \left( \frac{1}{R_p} + \frac{1}{R_{s,p}} \right)^{-1}$$

and where $Q_{tank} > 1.5$, $R_{s,p}$ is approximately given for a monomial, $$R_{s,p} = \left[\left(1 + \left(\frac{L_s\omega}{R_s}\right)^2\right]R_s \approx (L_s\omega)^2 R_s.$$

Since both $R_p$ and $R_{s,p}$ are given by monomial expressions, $R_{tank}$ is an inverse-posynomial function of the design variables and therefore $R_{tank}$ can be maximized. A typical design problem can then be posed as a geometric program, maximize  $R_{tank}$  (25)

subject to  $L_{tank} C_{tank} \leq \dfrac{1}{\omega_{res}^2}$ $Q_{tank} \geq Q_{tank,min}$ $C_{ext} \leq C_{ext,max}$

...

Other design constraints such as inductor area, minimizing the turn spacing and width, etc., can be considered can still be solved as a geometric program.

Figure 10:
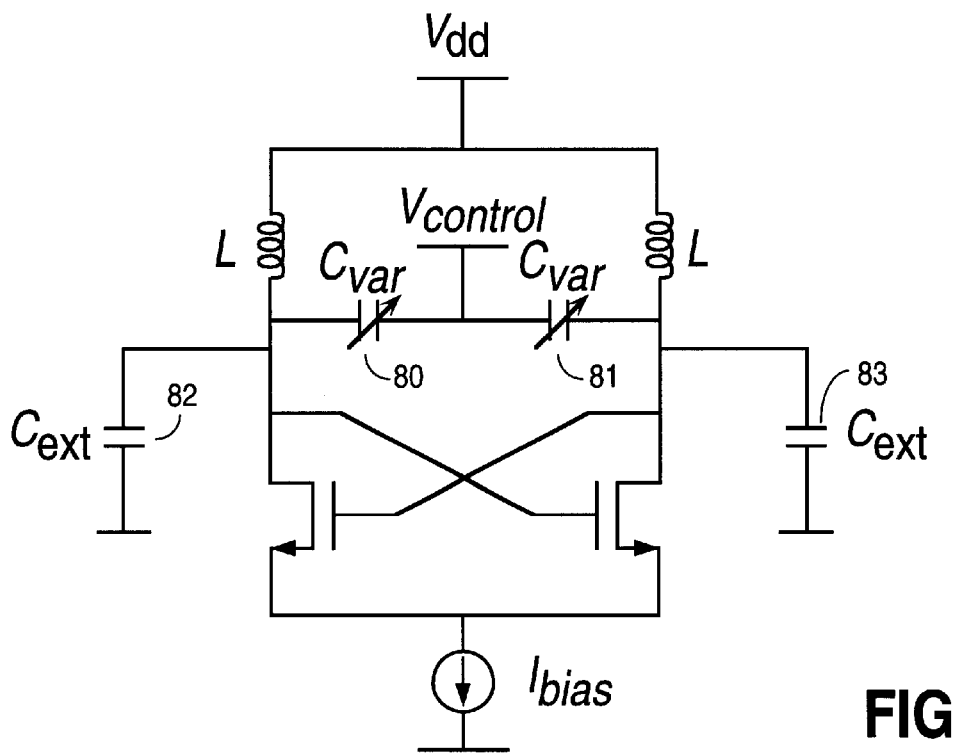
FIG. 10 is an equivalent circuit for a tunable LC resonator.
Figure 11A:
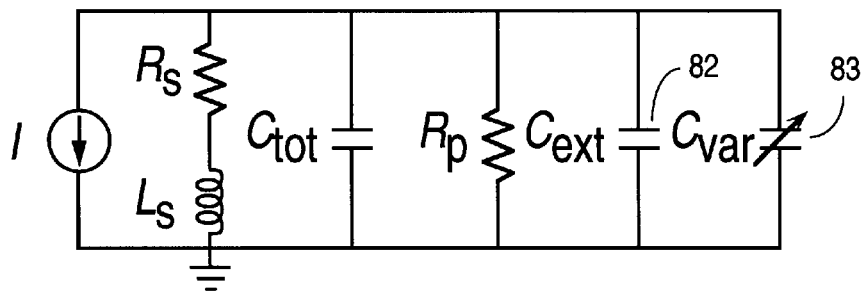
FIG. 11a is a small-signal equivalent circuit for the circuit of FIG. 10.
Figure 11B:
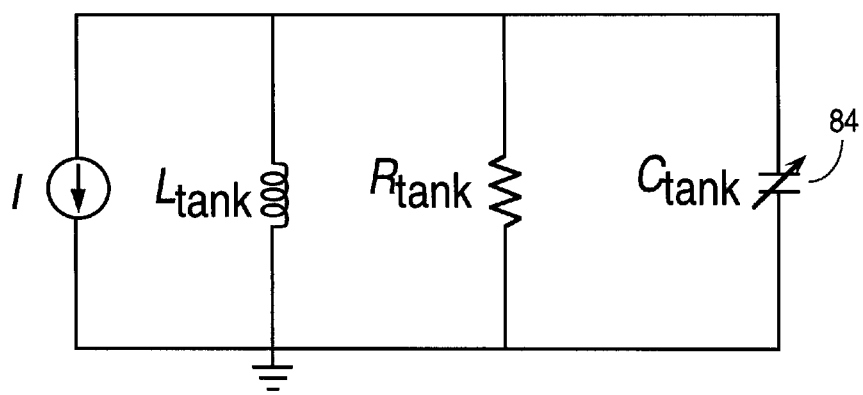
FIG. 11b is another equivalent circuit for the circuit of FIG. 10.

The example of FIGS. 8 and 9 can be extended to a tuned resonator such as shown in FIG. 10. Note that FIG. 8 is the differential half circuit of the oscillator of FIG. 10 with the addition of the variable capacitors 80 and 81. While the value of the capacitors 80 and 81 are not limited, the ratio of the maximum to minimum capacitance is limited to approximately 2. Capacitors 82 and 38 ($C_{ext}$) again represent the additional capacitance loading. FIG. 11a corresponds to FIG. 9a and represents the simplified small signal half circuit of the oscillator of FIG. 10. Similarly, FIG. 11b corresponds to FIG. 9b except that the tank capacitor of FIG. 11b includes the variable capacitance component.

Typically, the design goal is to maximize the power resistance for parallel resistance for a given tuning range. The tuning range is specified with two constraints $$L_{tank}(C_{ext} + C_{tot} + C_{var,min}) \leq \frac{1}{\omega_{res,max}^2} \quad (26)$$

$$L_{tank}(C_{ext} + C_{tot} + C_{var,max}) \geq \frac{1}{\omega_{res,min}^2}. \quad (27)$$

Constraint 27 is not posynomial and cannot be directly solved by a geometric program. However, Constraint 26 is generally tight (if it were loose it would mean that an inductor with wider turns could be used and a better $R_{tank}$ could be obtained. This fact allows the handling of constraint (27) which can be written as)

$$\omega_{res,min}^2(C_{ext}+C_{tot}+C_{var,max}) \geq \omega_{res,max}^2(C_{ext}+C_{tot}+C_{var,min}). \quad (27a)$$

If we let $$r = \frac{\omega_{res,max}^2}{\omega_{res,min}^2},$$

then $$(r-1)\frac{C_p}{C_{var,max}} + (r-1)C_{ext} + rC_{var,min} \leq 1. \quad (28)$$

Substituting the constraint 27 by the posynomial constraint 28, the design can probably be written as, maximize  $R_{tank}$  (29)

subject to  $L(C_{ext} + C_{tot} + C_{var,min}) \leq \dfrac{1}{\omega_{res,max}^2}$ $(r-1)\dfrac{C_p}{C_{var,max}} + (r-1)C_{ext} + rC_{var,min} \leq 1$ $C_{var,min} \geq \alpha C_{var,max}$ $Q \geq Q_{min}$

...

Figure 15:
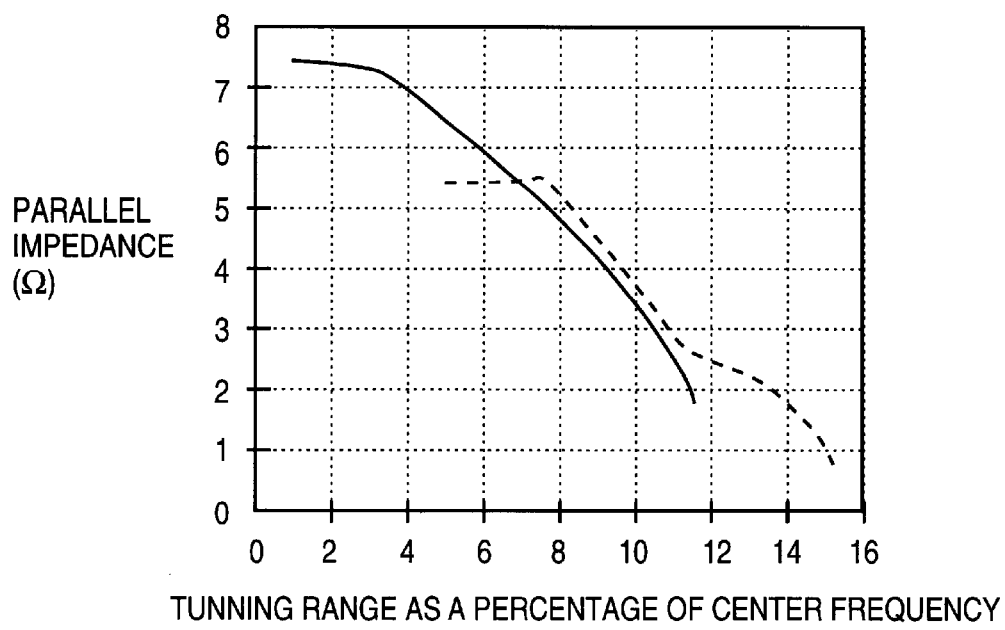
FIG. 15 is a graph illustrating the performance of the LC tunable oscillator of FIG. 10 where maximum parallel tank impedance is plotted against tuning range.

FIG. 15 shows the maximum parallel tank impedance versus the tuning range for the oscillator when built with PGS. The design constraints used are shown in Table 3 below. Note that the maximum parallel impedance is high when the tuning ratio is small. When the desired tuning ratio is high, only a small inductance can be used since it contributes less parasitic capacitance and the maximum parallel impedance decreases.

TABLE 3

| | |
|---|---|
| $Q_{TANK}$ | $\geq 1$ |
| Metal spacing | $\geq 1.9\ \mu m$ |
| Metal width | $\geq 1.9\ \mu m$ |
| Inductance | $\geq 1$ nH |
| Additional capacitance | 300 fF |

Figure 12A:
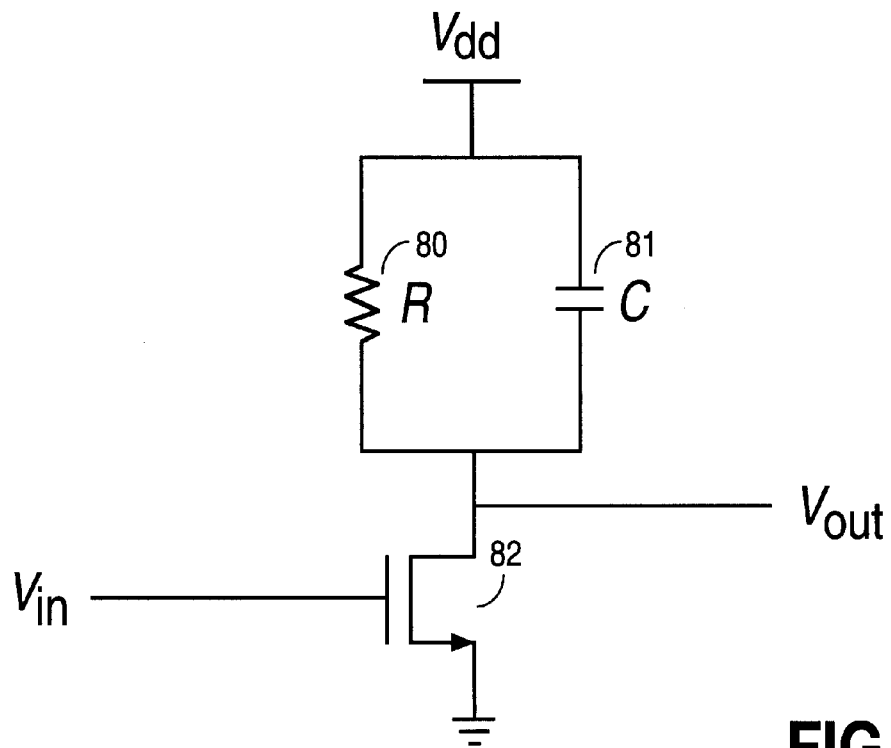
FIG. 12a is a single-pole common source amplifier.
Figure 12B:
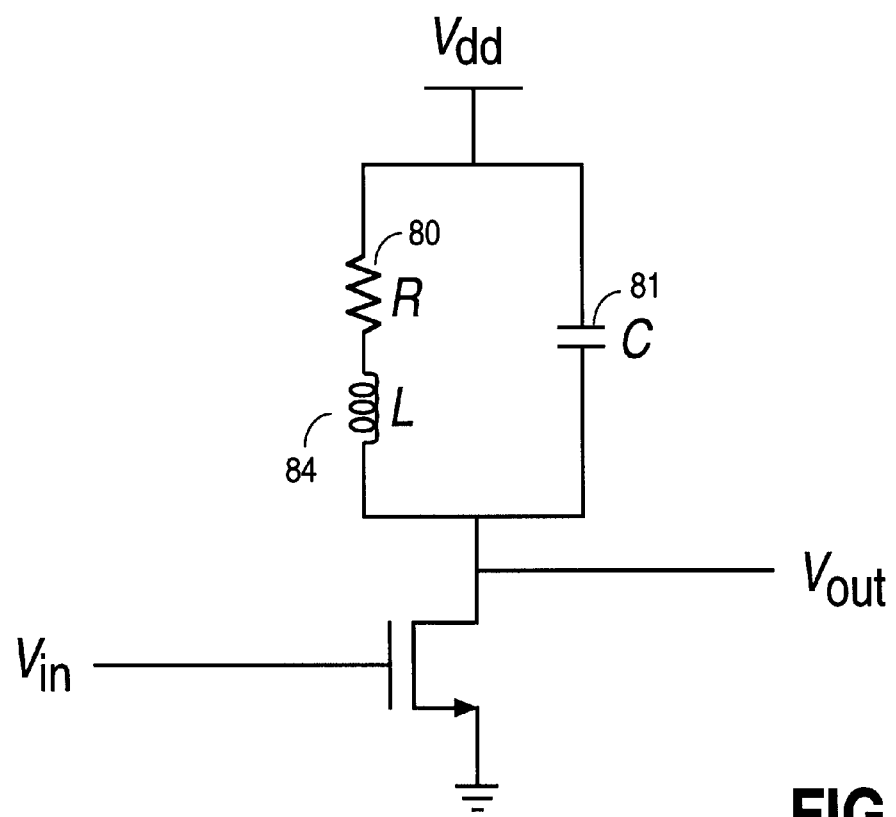
FIG. 12b illustrates the circuit of 12a with an inductor in series with the resistor, this circuit having a double-pole single-zero system.

The discussion above can also be used in the design of a shunt-peaked amplifier. As shown in FIG. 12a the amplifier has the parallel combination of resistor 80 and capacitor 81 coupled in series with the transistor 82. This single-pole common source amplifier has a 3 dB frequency of approximately $2\pi/RC$. The introduction of an inductor 84, as shown in FIG. 12b, provides a double-pole, single-zero system with a frequency response which is determined by the time constant ratio (m), $$m = \frac{CR}{L/R}. \quad (29a)$$

The optimal value of m is determined by whether the design goal is to maximize bandwidth, minimize group delay or achieve maximally flat response.

In an integrated circuit implementation, the series resistance of the spiral inductor is absorbed in the resistor 80 and the capacitance $C_{tot}$ is added to the capacitor 81. The design goal is to minimize the capacitance added by the inductor so that a large bandwidth can be obtained.

minimize  $C_{tank}$  (30)

subject to  $L_{tank} = \dfrac{R^2 C_{tank}}{m}$ $w > w_{min}.$ $C_{tank} \geq C + C_{tot}$

...

Note that the last constraint is always tight. If it were not, one could obtain a smaller value for $C_{tank}$, and the result would not be optimal. This geometric program can be resolved as discussed above and additionally, other design constraints can be considered.

Thus, the design specifications for several different inductor circuits can be represented by posynomial expressions as described above. This enables the translation of the expression into one solvable via geometric programs and permits the circuits to be optimized efficiently and globally.

We claim:

1. A method for designing an inductor comprising the steps of:

representing the inductor as an equivalent circuit having a plurality of lumped parameters including a parameter for inductance;

representing each of the lumped parameters as a first posynomial expression, the expression for inductance having at least one term for a physical dimension and another term for number of turns;

expressing one or more characteristics of the inductor as second posynomial expressions with a constraint based on the first posynomial expressions; and solving in a computer the second posynomial expressions with the constraint as a geometric program;

outputting from the computer at least one physical dimension or the number of turns for use in fabricating an inductor.

2. The method defined by claim 1 wherein the constraint results in an inequality.

3. The method defined by claim 1 wherein the constraint is equal to or less than one.

4. The method defined by claim 1 wherein the second posynomial is a monomial.

5. The method defined by claim 4 wherein the constraint results in an equality.

6. The method defined by claims 1, 2 or 3 wherein each of the first posynomials are monomials.

7. The method defined by claim 1 wherein the expression for the one or more characteristics optimizes a performance characteristic.

8. The method defined by claim 2 wherein the performance characteristic is a quality factor for the inductor.

9. The method defined by claim 7 wherein the performance characteristic is a frequency response of the inductor.

10. The method defined by claim 1 wherein the expression for the one or more characteristics of the inductor optimizes area needed to fabricate the inductor as an integrated circuit.

11. The method defined by claims 2 or 3 including translating the posynomial inequality into a convex geometric program.

12. The method defined by claim 1 wherein the first posynomial expressions for the lumped parameter include integrated circuit process dependent terms.

13. The method defined by claim 12 wherein the first expression for inductance is a monomial expression which only includes layout dependent variables.

14. The method defined by claim 13 wherein the layout dependent variables include: turn width, turn spacing, outer diameter and average diameter of the inductor.

15. The method defined by claim 1 wherein the equivalent circuit is a one port model of the inductor.

16. A method for optimizing an integrated circuit inductor comprising the steps of:

representing the inductor as a plurality of first posynomial expressions which include process dependent terms and a first monomial expression for inductance which only includes terms which are layout dependent;

selecting at least one characteristic of the inductor which is to be optimized;

expressing the optimized characteristic as a posynomial inequality using the first posynomial expression and second monomial expression third; and solving the posynomial inequality as a convex geometric program in a computer: outputting from the computer at least one specific dimension in the layout of the inductor for use in fabricating the inductor.

17. The method defined by claim 16 wherein the terms which are layout dependent for inductance include the number of turns and at least one physical dimension of the inductor.

18. The method defined by claim 16 wherein the layout dependent terms include the number of turns, turn width, turn spacing, outer diameter and average diameter of the inductor.

19. The method defined by claim 17 wherein the characteristic is a quality factor for the inductor.

20. The method defined by claim 17 wherein the characteristic is a frequency response of the inductor.

21. The method defined by claim 16 wherein the characteristic optimizes area needed to fabricate the inductor.

22. A method for optimizing the performance of a circuit which includes an inductor comprising the steps of:

representing the circuit including the inductor as an equivalent circuit having a plurality of lumped parameters including a parameter for inductance;

representing each of the lumped parameters as a first posynomial expression, the parameters for inductance having at least one term for a physical dimension and another term for a number of turns;

expressing one or more characteristics of the circuit as a second posynomial inequality based on the first expressions; and solving the second posynomial inequality as a geometric program in a computer;

outputting from the computer at least one physical dimension or the number of turns of the fabrication of the inductor.

23. The method defined by claim 22 wherein the circuit comprises a low noise amplifier wherein the characteristic that is optimized is a quality factor for the inductor.

24. The method defined by claim 22 wherein the circuit is a resonator and the characteristic optimized is maximization of the circuit's impedance at a resonant frequency.

25. The method defined by claim 22 wherein the circuit is a tunable resonator and the characteristic optimized is a maximization of resistance over a predetermined tuning range.

26. The method defined by claim 22 wherein the circuit is a shunt-peak amplifier and the characteristic optimized is maximization of bandwidth.

27. The method defined by claim 22 wherein the circuit is a shunt-peak amplifier and the characteristic which is optimized is to minimize group delay.

28. The method defined by claim 22 wherein the circuit is a shunt-peak amplifier which is optimized is to achieve maximal flat response.

29. The method defined by claims 23, 24, 25, 26, 27 or 28 wherein the second posynomial expression is translated into a convex geometric program.

30. The method defined by claim 29 wherein the first monomial expression for inductance includes layout dependent terms.

31. The method defined by claim 30 wherein the layout dependent terms include turn width, turn spacing, outer diameter and average diameter of the inductor.

* * * * *